United States Patent [19]

Swanson et al.

[11] Patent Number: 4,737,731

[45] Date of Patent: Apr. 12, 1988

[54] METHOD AND APPARATUS FOR REDUCING DISTORTION IN AMPLIFIERS

[75] Inventors: Hilmer I. Swanson; Scott A. McFarland, both of Quincy, Ill.

[73] Assignee: Harris Corporation, Melbourne, Fla.

[21] Appl. No.: 922,761

[22] Filed: Oct. 24, 1986

Related U.S. Application Data

[63] Continuation of Ser. No. 721,909, Apr. 10, 1985, abandoned.

[51] Int. Cl.$^4$ ............................................. H03F 1/26
[52] U.S. Cl. ...................................... 330/149; 330/10
[58] Field of Search ............... 330/10, 11, 149, 207 A, 330/251, 290; 455/108; 332/38

[56] References Cited

U.S. PATENT DOCUMENTS

| | | | |
|---|---|---|---|
| 3,662,290 | 5/1972 | Elliott | 332/38 |
| 4,199,723 | 4/1980 | Cummings et al. | 455/108 |
| 4,247,948 | 1/1981 | Okada et al. | 332/38 X |

*Primary Examiner*—Eugene R. LaRoche
*Assistant Examiner*—Steven J. Mottola
*Attorney, Agent, or Firm*—Tarolli, Sundheim & Covell

[57] ABSTRACT

Amplitude modulation apparatus is provided having means for providing a radio frequency carrier signal, and means for receiving an audio frequency signal to be used to amplitude modulate the RF carrier signal. Amplitude modulator means is provided responsive to the AF signal and to the RF carrier signal for amplitude modulating the RF carrier signal in accordance with the AF signal so as to thereby provide an amplitude modulated RF carrier signal. A power supply provides at least one DC power signal for powering the amplitude modulator means. Correction means is included for sensing variations in the DC power signal and for gain adjusting the audio frequency signal in accordance with the variations in the DC power signal, whereby modulation distortion of the amplitude modulated RF carrier signal is reduced.

10 Claims, 1 Drawing Sheet

METHOD AND APPARATUS FOR REDUCING DISTORTION IN AMPLIFIERS

This application is a continuation of application Ser. No. 721,909, filed Apr. 24, 1985 now abandoned.

BACKGROUND AND FIELD OF THE INVENTION

The present invention relates to amplifiers, and more particularly to amplifiers including apparatus for eliminating distortion caused by noise on the DC power supply line, including slow variations in the DC supply voltage, AC ripple and audio signals coupled through the power supply line.

It is known that noise appearing on a DC power signal applied to the power input of an amplifier can and will be coupled to the output of the amplifier as hum, intermodulation distortion, and noise. Power supply noise is of particular concern in high power amplifiers, such as those found in the transmitters conventionally used in commercial AM broadcasting. DC power supplies are, therefore, designed to reduce as far as possible the magnitude of the noise present on the DC power supply lines.

Typically, small de-coupling capacitors having low impedance at high frequencies are connected across the power supply output to reduce high frequency noise on the power supply line. Large capacitors (usually electrolitic) are connected across the power supply to reduce low frequency DC supply voltage variations and AC ripple. In theory, the level of low frequency noise could be reduced to any desired degree by connecting a suitably large amount of capacitance across the power supply output. Unfortunately, the low frequency filter capacitors used in high power DC power sources are quite large both in volume and in weight. The inclusion of further power supply filtering capacitors is undesirable both due to the cost of such capacitors, and to their size.

Another known method of combating power supply noise effects is through the use of negative feedback. Noise in the output signal is detected, and is feedback to the input of the amplifier in such a fashion as to reduce the overall magnitude of the noise. The feedback signal is combined with the input signal in an additive combiner circuit. Feedback systems are undesirable both due to the difficulty of isolating the noise, and to the instability problems inherent in any feedback system.

SUMMARY OF THE INVENTION

It is a general object of the present invention to improve upon existing amplifier apparatus.

It is another object of the present invention to reduce the effect of power supply noise on the amplifier output signal by dynamically adjusting of the gain of the input signal.

It is still another object of the present invention to achieve the foregoing objects in the power amplifier stage of an AM transmitter.

In accordance with the present invention, amplitude modulation apparatus is provided. The amplitude modulation apparatus includes means for providing a radio frequency carrier signal, and means for receiving an audio frequency signal to be used to amplitude modulate the RF carrier signal. Amplitude modulator means is provided responsive to the AF signal and to the RF carrier signal for amplitude modulating the RF carrier signal in accordance with the AF signal so as to thereby provide an amplitude modulated RF carrier signal. Power supply means provides at least one DC power signal for powering the amplitude modulator means. Correction means is included for sensing variations in the DC power signal and for gain adjusting the audio frequency signal in accordance with the variations in the DC power signal, whereby modulation distortion of the amplitude modulated RF carrier signal is reduced.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

In the detailed description which follows, the invention is described in the environment of an AM (amplitude modulation) transmitter. The invention will have utility in reducing distortion in any high power amplifier, however. Thus, it should be understood that the invention is not limited to the field of transmitters.

Figure 1:
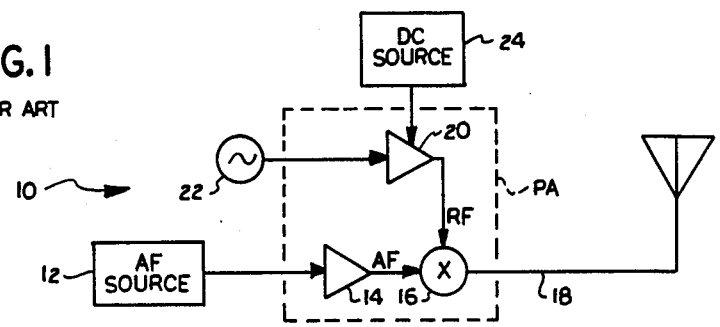
FIG. 1 is a block diagram of a prior art amplitude modulator.

FIG. 1 is a model of a conventional high power AM transmitter. In FIG. 1, the transmitter 10 is shown as including a power amplifier (PA) stage responsive to signals provided by an audio frequency source 12, a radio frequency source 22, and a DC power surce 24. The PA stage is represented in FIG. 1 as including three separate elements: a high power audio frequency (AF) amplifier 14, a high power radio frequency (RF) amplifier 20, and an amplitude modulator 16. In practice, however, a PA stage usually does not contain a separate and distinct amplitude modulator. Instead, the output stages of the two amplifiers 14 and 20 are connected in series across the output of the DC power source, thereby producing amplitude modulation of the high power RF signal. The net affect is the same, and for discussion purposes it is convenient to model the PA as shown.

In FIG. 1, the high powered audio amplifier 14 amplifies the audio frequency signal supplied by AF source 12, providing the resulting high power audio signal to the amplitude modulator 16. Amplitude modulator 16 is represented in FIG. 1 as a multiplier, responsive at one input to the high power audio frequency signal provided by amplifier 14, and at the other input to a high power radio frequency (RF) signal. The high power RF signal is derived from the RF amplifier 20, which amplifies the RF signal provided by the RF carrier source 22. The output signal provided by the amplitude modulator 16 upon the output line 18 is a product of the two input signals, and has the form:

$$V_{out}(t) = (K_1[A(t)+1])(K_2 \cos W_c t) \quad (1)$$

where $V_{out}(t)$ is the output of mutiplier 16

$A(t)+1$ is the AF signal at the output of the AF source 12

$K_1$ is the gain of amplifier 14

$\cos W_c t$ is the RF signal at the output of the RF source 22

$K_2$ is the gain of amplifier 20

The $K_2$ term in equation (1) is a direction function of the magnitude of the DC power signal applied to the amplifier 20 by DC power source 24. In other words:

$$K_2 = K_3(DC + R(t)) \quad (2)$$

The term "DC" denotes the constant DC value of the power signal, whereas the term "R(t)" denotes the time varying power supply component, e.g., AC ripple, and voltage sag during periods of high current demand. The "$K_3$" term is a proportionality constant.

Substituting equation (2) into equation (1), we get:

$$V_{out}(t) = (K_1[A(t)+1])(K_3(DC+R(t))\cos W_c t) \quad (3)$$

From equation 3, it is apparent that the time varying component of the term $K_2$ introduces distortion into the output of multiplier 16 in direct proportion to the magnitude of the time varying component R(t) in the DC signal.

The time varying component R(t) could be reduced by the inclusion of additional filtering in the DC power source 24. In accordance with the present invention, however, the effects of the time variation in the DC signal are reduced by adjusting the gain of the audio signal in a manner to compensate for the distortion.

Figure 2:
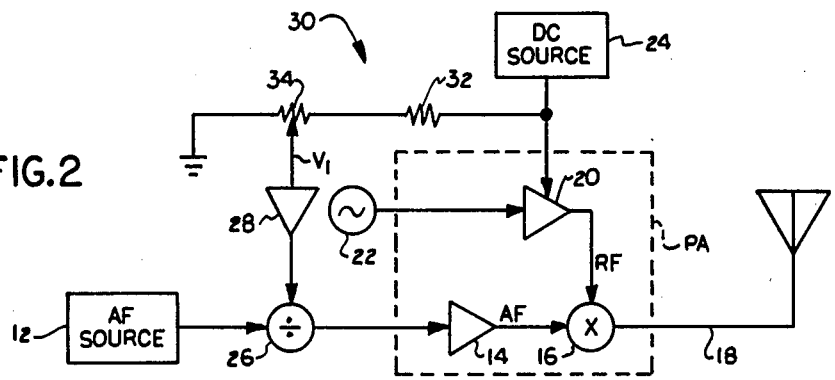
FIG. 2 is a block diagram of an amplitude modulator in accordance with the teachings of the present invention.

FIG. 2 is an illustration of a prior art amplitude modulation system as shown in FIG. 1, but modified in accordance with the teachings of the present invention. For simplicity of description, elements of FIG. 2 which correspond to elements of FIG. 1 are given corresponding reference numerals.

In FIG. 2, an analog divider circuit 26 is connected between the audio frequency source 12 and the amplifier 14. Divider 26 divides the audio signal by a signal ($V_1$) which is proportional to the signal provided by the DC source 24. In the FIG. 2 embodiment, the signal proportional to the output of DC source 24 is derived from a voltage divider 30 including a resistor 32 and potentiometer 34 connected in series across the output of the DC source 24. (Other circuits could of course be used to derive the signal proportional to the output of the DC source.)

The signal proportional to the output of the DC source 24 is developed at the wiper arm of potentiometer 34. The wiper arm is connected to the input of the amplifier 28. The proportional signal $V_1$ has the form:

$$V_1 = (DC + R(t))/K_4 \quad (4)$$

where $K_4$ is a proportionality factor dependent upon the adjustment of the potentiometer 34. The output of the divider circuit 26 therefor has the form:

$$V_2 = (A(t)+1)K_4/(DC+R(t)) \quad (5)$$

substituting the righthand half of equation (5) for the expression "$A(t)+1$" in equation (3), we find that the output signal of multiplier 18 now has the form:

$$V_{out} = K_5(A(t)+1) \cos W_c t \quad (6)$$

where $K_5 = K_1 K_3 K_4$

Thus, the output signal provided by the amplitude modulator is now correctly equal to a product of the audio frequency signal and the radio frequency signal, so long as the proportionality factor $K_5$ is not time dependent.

The proportionality factor is equal to the product of three other proportionality terms $K_1$, $K_3$, and $K_4$. The term $K_1$ represents gain introduced by the amplifier 14. The gain of amplifier 14 is dependent upon the amplitude of its power supply, much as is the gain of amplifier 20. Amplifier 14, however, is powered by a different (and much smaller) power source (not shown), separate and apart from DC power source 24. The other power source is regulated well enough that DC variations are negligible. The term $K_1$ can therefore be treated as constant. The term $K_3$ is a proportionality constant relating the gain of amplifier 20 to the magnitude of a DC power supply signal. This proportionality will remain essentially constant, hence the term $K_3$ will similarly remain constant. The term $K_4$, finally, is fixed by the positioning of the potentiometer 34, and will remain constant as long as the potentiometer 34 is not adjusted. It therefore follows that the proportionality constant since $K_1$, $K_3$ and $K_4$ are essentially constant, $K_5$ will have a value which is also constant, whereby the output of the amplitude modulator will be closely representative of the true product of the audio frequency and radio frequency signals.

Figure 3:
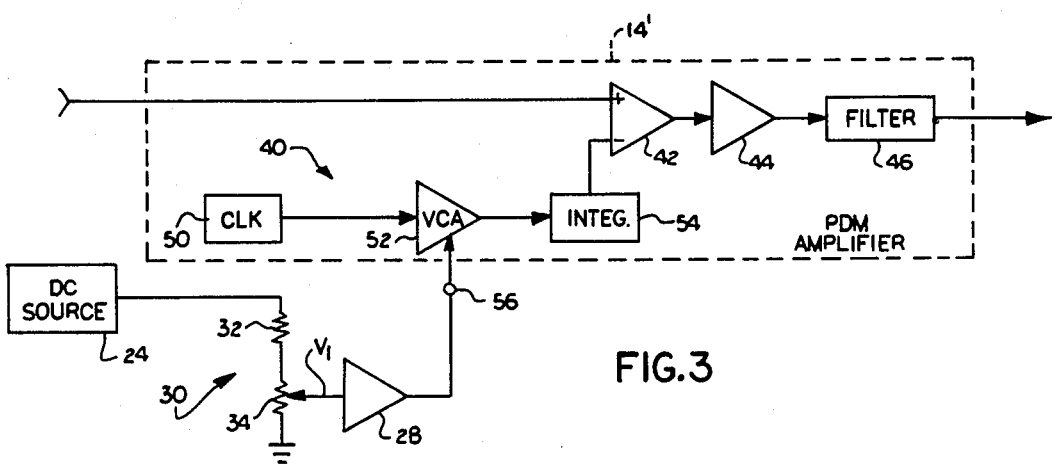
FIG. 3 is a block diagram of a second type of amplitude modulator incorporating the teachings of the present invention.

In the FIG. 2 embodiment, the gain-adjusting element is a conventional analog divider. The gain control element can take other forms, however. For example, the gain of the amplifier 14 may, itself, be controlled in an inverse relation to the signal $V_1$, thus producing essentially the same result. In such a system, the analog divider 26 is omitted, and the output of buffer amplifier 28 is applied directly to the gain control input of amplifier 14. FIG. 3 is a block diagram showing one form which the amplifier 14' could take in such an embodiment.

In FIG. 3, the amplifier 14' is shown as comprising a pulse duration modulation (PDM) amplifier. The pulse duration modulator includes circuitry 40 for generating a generally triangular periodic reference waveform, and a comparator 42 for comparing the audio signal against the reference waveform. The output of the comparator 42 will be a periodic pulse train. The individual pulses of the pulse train all have the same amplitude, but have durations which are directly dependent upon the magnitude of the audio signal at the time of occurrence of that pulse. Thus, as the audio signal increases in amplitude, the duration of the pulses increases proportionately. Similarly, if the audio signal diminishes in amplitude, the duration of the pulses at the output of comparator 42 diminishes accordingly.

The pulses at the output of the comparator 42 are applied to the input of a class D amplifier 44. Amplifier 44 operates with high efficiency since it switches back and forth between cutoff and saturation, rather than linearly amplifying the pulses. A filter 46 is connected to the output of amplifier 44 in order to recover the audio signal from the high power pulse duration modulated signal at the output of amplifier 44. The filter 46 is a low pass filter which has a cutoff frequency below the frequency of the reference signal supplied by the reference circuitry 40. Thus, the PDM carrier signal is effectively eliminated by the filter 46, leaving only a high power audio signal remaining.

The circuitry 40 which generates the periodic reference signal includes a clock circuit 50, a voltage controlled amplifier 52, and integrator 54. Clock 50 provides a squarewave output signal having a frequency equal to the desired PDM carrier frequency. The squarewave signal is amplified by the voltage controlled amplifier 52 and then integrated by the integrator 54, resulting in a triangular wave signal having a fixed frequency, but an amplitude directly dependent upon the gain of the voltage controlled amplifier 52.

The gain control input 56 of the voltage controlled amplifier 52 is connected to the output of buffer amplifier 28, and thus carries the signal $V_1$ which is proportional to the output of DC source 24. If the signal provided by the DC source 24 increases, then the gain of the voltage controlled amplifier 52 increases in direct proportion. Thus, the amplitude of the squarewave signals applied to the input to integrator 54 increases in amplitude, resulting in a similar increase in the magnitude of the reference waveform appearing at the output of the integrator. An increase in the amplitude of the reference waveform results in a corresponding decrease in the duration of the pulse at the output of comparator 42, thus effectively reducing the gain of the PDM amplifier 14. A decrease in the magnitude of the signal provided by DC source 24 will produce a corresponding increase in the gain of PDM amplifier 14. Thus, the PDM amplifier shown in FIG. 3 serves not only to amplify the audio frequency signal, but to also divide it by the signal $V_1$ proportional to the output of the DC source 24.

In FIG. 3, the amplifier is a single phase PDM amplifier. The amplifier 14' could instead, however, comprise a multiple phase PDM amplifier as disclosed in U.S. Pat. No. 4,164,714 (issued Aug. 14, 1979 to Hilmer Swanson), assigned to Harris Corporation.

Figure 4:
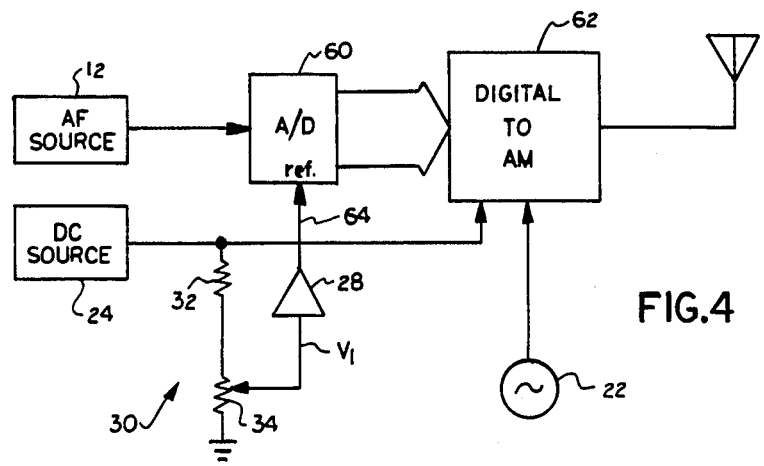
FIG. 4 is a block diagram of yet another type of amplitude modulator incorporating the teachings of the present invention.

Other methods of effectively dividing the audio frequency signal by the signal proportional to the DC source may be employed in appropriate other circumstances. In some transmitters, for example, the audio frequency signal is converted into a digital signal, and the parallel digital word at the output of the analog-to-digital converter is thereafter used in the generation of an amplitude modulated RF signal. One example of such a system is shown in FIG. 4. For convenience of description, again, elements of FIG. 4 which correspond to identical elements of FIG. 2 are given corresponding reference numbers.

As shown in FIG. 4, the output of the audio frequency source 12 is applied to the analog input of an analog-to-digital converter 60. The parallel word at the output of the analog-to-digital converter is applied to the input of a digital-to-AM conversion circuit 62. The circuit 62 also receives an RF carrier signal from a source 22, and a DC power supply signal from a DC source 24. Systems including elements corresponding to blocks 12, 22, 24, 60 and 62 are described in U.S. Pat. No. 4,403,197, issued Sept. 6, 1983 to Hilmer Swanson and assigned to Harris Corporation, and in U.S. patent application Ser. No. 334,083, filed Dec. 24, 1983 in the name of Hilmer Swanson, and also assigned to Harris Corporation. The contents of U.S. Pat. No. 4,403,197 and U.S. patent application Ser. No. 334,083 are incorporated herein by reference.

Analog-to-digital converter 60 is of conventional form, and includes a reference signal input line 64 which effectively controls the gain of the transfer function between the input audio signal and the output digital signal. As the reference signal is increased, the magnitude of the digital word provided in response to a specific analog input signal diminishes, whereas if the reference signal decreases, the value of the digital word provided for the same analog input signal increases. The gain of the audio signal is therefore, in essence, divided by the signal applied to the reference input of the converter.

As in the preceding embodiments, circuitry 30 is included for generating a signal proportional to the output of the DC source 24. In the FIG. 4 embodiment, the proportional signal $V_1$ is applied to the reference input of the analog-to-digital converter 60, thereby automatically providing the division function without the need for the separate circuitry used in the previous two embodiments.

Although the invention has been described with respect to preferred embodiments, it will be appreciated that other variations and alterations of parts may be made without departing from the spirit and scope of the present invention, as defined in the appended claims.

What is claimed is:

1. Amplifier apparatus for reducing affects of power supply noise comprising:
   means for receiving an input signal for amplification;
   DC power supply means for providing a D.C. power signal;
   amplifier means powered by said D.C. power signal for amplifying said input signal to provide an output signal in accordance therewith;
   means for effectively varying the gain of said amplifier means inversely proportional to said DC power signal so as to compensate for gain changes introduced by noise variations in said DC power signal;
   means for dividing said input signal with a second signal prior to amplification; and
   said gain varying means comprises means for generating a signal proportional to said DC power signal and for providing said signal proportional to said DC power signal to said divider means as said second signal.

2. Amplifier apparatus as set forth in claim 1, wherein said means for generating a signal proportional to said DC power signal comprises a resistive voltage divider connected across said DC power supply means.

3. Amplifier apparatus as set forth in claim 1, wherein said dividing means comprises an analog divider circuit.

4. Amplifier apparatus for reducing affects of power supply noise comprising:
   means for receiving an input signal for amplification;
   DC power supply means for providing a DC power signal;
   means for effectively dividing said input signal by a signal proportional to said DC power signal so as to provide a gain adjusted input signal whose amplitude varies in inverse relation to noise changes in said DC power signal; and
   amplifier means powered by said DC power signal for amplifying said gain adjusted input signal to provide an output signal in accordance therewith, said output signal being unaffected by variations in said DC power signal because of the gain compensation provided by said effective dividing means.

5. Amplifier apparatus as set forth in claim 4, wherein said effective dividing means comprises sensing means for providing a sense signal having a value proportional to said DC power signal, and dividing means for dividing said input signal by said sense signal so as to thereby provide said gain adjusted input signal.

6. Amplifier apparatus as set forth in claim 5, wherein said sensing means comprises a resistive voltage divider.

7. Amplifier apparatus as set forth in claim 4, wherein said means for effectively dividing said input signal by a signal proportional to said DC power signal comprises sensing means for providing a sense signal having a value proportional to said DC power signal, and gain adjusting means for causing the gain of said amplifier means to vary as an inverse function of said sense signal.

8. Amplitude modulation apparatus for reducing affects of power supply noise comprising:
  means for providing a radio frequency (RF) carrier signal;
  means for receiving an audio frequency (AF) signal to be used to amplitude modulate the RF carrier signal;
  amplitude modulator means responsive to the AF signal and to the RF carrier signal for amplitude modulating the RF carrier signal in accordance with the AF signal so as to thereby provide an amplitude modulated RF carrier signal;
  power supply means for providing at least one DC power signal for powering the amplitude modulator means; and
  correction means for sensing variations in the DC power signal and for gain adjusting the AF signal in inverse relationship with noise variations in the DC power signal, whereby modulation distortion of said amplitude modulated RF carrier signal is reduced;
  said correction means comprises:
  means for providing a DC variation signal which varies as a function of said DC power signal variations, and
  divider means for dividing said AF signal by said DC variation signal, and for providing the resulting gain adjusted AF signal to said amplitude modulator means.

9. Amplitude modulation apparatus comprising:
  means for providing a radio frequency (RF) carrier signal;
  means for receiving an audio frequency (AF) signal to be used to amplitude modulate the RF carrier signal;
  amplitude modulator means responsive to the AF signal and to the RF carrier signal for amplitude modulating the RF carrier signal in accordance with the AF signal so as to thereby provide an amplitude modulated RF carrier signal;
  power supply means for providing at least one power signal for powering the amplitude modulator means; and
  correction means for sensing variations in the DC power signal and for adjusting the AF signal in inverse relationship with noise variations in the D.C. power signal, whereby modulation distortion of said amplitude modulated RF carrier signal is reduced;
  said corretion means comprises means for providing a DC variation signal which varies as a function of said DC power signal variations, and gain controlled amplifier means for adjusting the gain of said AF signal as inverse function of said DC variation signal.

10. Apparatus as set forth in claim 9, wherein said gain controlled amplifier means comprises a pulse duration modulation amplifier including means for generating a periodic reference signal, means for varying the amplitude of said reference signal as a direct function of said DC variation signal, comparing means for producing a duration modulated pulse signal by comparing said reference signal against said AF signal, and means for amplifying and demodulating said duration modulated pulse signal.

* * * * *